(12) United States Patent
Huang et al.

(10) Patent No.: US 11,737,236 B2
(45) Date of Patent: Aug. 22, 2023

(54) KNOCKDOWN WATER-COOLING MODULE LATCH DEVICE STRUCTURE

(71) Applicant: ASIA VITAL COMPONENTS CO., LTD., New Taipei (TW)

(72) Inventors: Kuan-Lin Huang, New Taipei (TW); Jun-Chun Chiu, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 273 days.

(21) Appl. No.: 17/098,451

(22) Filed: Nov. 16, 2020

(65) Prior Publication Data

US 2022/0159868 A1    May 19, 2022

(51) Int. Cl.
*H05K 7/20*    (2006.01)

(52) U.S. Cl.
CPC ................ *H05K 7/20218* (2013.01)

(58) Field of Classification Search
CPC .. F28F 13/00; H05K 7/20218; H05K 7/20272
See application file for complete search history.

(56) References Cited

U.S. PATENT DOCUMENTS

| | | | |
|---|---|---|---|
| 5,089,936 A | 2/1992 | Kojima et al. | |
| 7,300,170 B2* | 11/2007 | Jasmin | G02B 27/028<br>359/872 |
| 7,420,808 B2* | 9/2008 | Campbell | H05K 7/20772<br>165/80.4 |
| 7,864,537 B2* | 1/2011 | Kim | G01R 31/2808<br>257/718 |
| 9,733,681 B2* | 8/2017 | Eriksen | G06F 1/20 |

FOREIGN PATENT DOCUMENTS

| | | |
|---|---|---|
| CN | 102067063 B | 3/2013 |
| CN | 204497214 U | 7/2015 |
| JP | 2000220988 A | 8/2000 |
| TW | M607238 U | 2/2021 |

OTHER PUBLICATIONS

Search Report dated Jun. 16, 2021 issued by Taiwan Intellectual Property Office for counterpart application No. 109135951.

* cited by examiner

*Primary Examiner* — Lionel Nouketcha
(74) *Attorney, Agent, or Firm* — Demian K. Jackson; Jackson IPG PLLC

(57) ABSTRACT

A knockdown water-cooling module latch device structure is assembled and connected with a water-cooling module. The knockdown water-cooling module latch device structure includes a latch device assembly having multiple latch members. The multiple latch members are correspondingly assembled and connected with each other around the water-cooling module to form the knockdown water-cooling module latch device structure, whereby the water-cooling module is framed in the latch device assembly. The knockdown water-cooling module latch device structure can be conveniently assembled and has high assembling freeness and better structural strength.

6 Claims, 5 Drawing Sheets

KNOCKDOWN WATER-COOLING MODULE LATCH DEVICE STRUCTURE

BACKGROUND OF THE INVENTION

1. Field of the Invention

The present invention relates generally to a knockdown water-cooling module latch device structure, and more particularly to a water-cooling module latch device structure, which can be conveniently assembled and has high assembling freeness and better structural strength.

2. Description of the Related Art

Along with the great enhancement of the requirement for big data and cloud computing service, the requirement for heat dissipation of related electronic products (such as computer, server, large-scale operation center or communication chassis) has become higher and higher. Especially, with respect to the server of a large-scale operation center, the operation density is increased so that the waste heat generated in the space with the same size is greatly increased. In order to reduce the energy consumed in heat dissipation, the design of the heat sink has been gradually converted from the air-cooling of the conventional fan into liquid-cooling, in which the heat is carried away from the server to dissipate to the environment. This can solve the problem of high-density waste heat.

In the conventional air-cooling electronic product, each chip has one single corresponding heat sink. In case there are multiple chips in the system, multiple air-cooling heat sinks are arranged in the system corresponding to the chips. With respect to a liquid-cooling product, it is necessary to arrange water pipelines in a limited space of the case. In the narrow space, the main factors affecting the arrangement of the pipelines are: the arrangement of the motherboard, the direction of the inlet and outlet of the water-cooling plate, the inner and outer diameters of the pipelines, the minimum bending radius of the pipeline, etc.

In the process of conversion from air-cooling into liquid-cooling, it often takes place that the motherboard of the client end is designed with air-cooling arrangement, which can be hardly changed into liquid-cooling arrangement. As a result, when laying the pipelines of the water-cooling unit, the downstream manufacturer is limited everywhere. This leads to a lot of affections on the change of the design of the water-cooling product.

Please refer to FIGS. 4A and 4B. In order to have better heat transfer effect, the water block 3 is made of a softer material such as copper. When the water block 3 is secured near a heat source (such as central processing unit (CPU), graphics processing unit (GPU), Southbridge/Northbridge chipsets or application specific integrated circuit (ASIC)), the water block 3 made of softer material cannot be directly locked on the heat source. Therefore, it is necessary to first fit an integrated latch device 4 onto the water block 3 from the upper side to the lower side with the two notches 41 of the latch device 4 passing through the corresponding L-shaped water incoming nozzle 31 and the water-outgoing nozzle 32 disposed on the water block 3. Then, after the latch device 4 is assembled with the water block 3, the latch device 4 is locked on the locking structure of the periphery of the heat source. In order to avoid leakage, the water incoming nozzle 31 and the water outgoing nozzle 32 disposed on the water block 3 are generally fixedly connected with the water block 3 by means of welding.

Therefore, in the case that the two notches 41 of the latch device 4 are arranged in a direction different from the arrangement direction of the incoming nozzle 31 and the water outgoing nozzle 32 of the water block 3, the incoming nozzle 31 or the water outgoing nozzle 32 will interfere with the latch device 4 to hinder the latch device 4 from fitting onto and connecting with the water block 3. Moreover, the water incoming nozzle 31 and the water outgoing nozzle 32 are secured on the water block 3 by means of welding and cannot be rotated to change the direction. Therefore, it is necessary for the manufacturer to additionally manufacture a different mold for making a latch device 4 corresponding to the arrangement direction of the water incoming nozzle 31 and the water outgoing nozzle 32 of the water block 3. As a result, different specifications/brands of water blocks 3 necessitate different molds. The manufacturing cost for the different mold is quite high. Moreover, the notches 41 formed on the latch device 4 with different angle will affect the entire structural strength of the latch device 4. In addition, it is necessary to long-term test and adjust the structural strength of all the latch devices 4 formed with different angles of notches 41 or redesign the entire structures of the latch devices 4. This leads to increase of the cost and consumes much working time.

In conclusion, the conventional water block 3 and latch device 4 have some shortcomings as follows:
1. The direction of the water incoming nozzle 31 and the water outgoing nozzle 32 of the water block 3 is limited by the installation manner of the water block 3.
2. Following the trend of chip design, the water block 3 may have insufficient structural strength. In addition, in the assembling process, only after the adaptive latch device 4 is mounted, the water pipelines can be mounted.
3. In the detachment, assembling or service of the water block 3, the water incoming nozzle 31 and the water outgoing nozzle 32 on the upper side will interfere with the one-piece (integrated) latch device 4 so that it is impossible to quickly detach, assemble and service the water block 3 in use. Therefore, it is inconvenient to use the water block 3.

It is therefore tried by the applicant to provide a knockdown water-cooling module latch device structure to solve the problem of interference of the latch device 4 with the water block 3 and the shortcoming that it is inconvenient and troublesome to assemble the latch device 4 with the water block 3 and the assembling freeness is low.

SUMMARY OF THE INVENTION

It is therefore a primary object of the present invention to provide a knockdown water-cooling module latch device structure, which can be conveniently assembled and has high assembling freeness.

It is a further object of the present invention to provide the above knockdown water-cooling module latch device structure, which can lower cost and has enhanced structural strength.

It is still a further object of the present invention to provide the above knockdown water-cooling module latch device structure, which includes a latch device assembly having at least two latch members. The latch members are assembled and connected with a water block (or a water-cooling plate), whereby the knockdown water-cooling module latch device structure has high assembling freeness and can be conveniently assembled without interfering with the water-cooling module.

To achieve the above and other objects, the knockdown water-cooling module latch device structure of the present invention is assembled and connected with a water-cooling module. The knockdown water-cooling module latch device structure includes a latch device assembly having multiple latch members. The multiple latch members are correspondingly assembled and connected with each other around the water block, whereby the water block is framed in the latch device assembly. The knockdown water-cooling module latch device structure can be conveniently assembled and has high assembling freeness and better structural strength. Also, the cost for the knockdown water-cooling module latch device structure is lowered.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
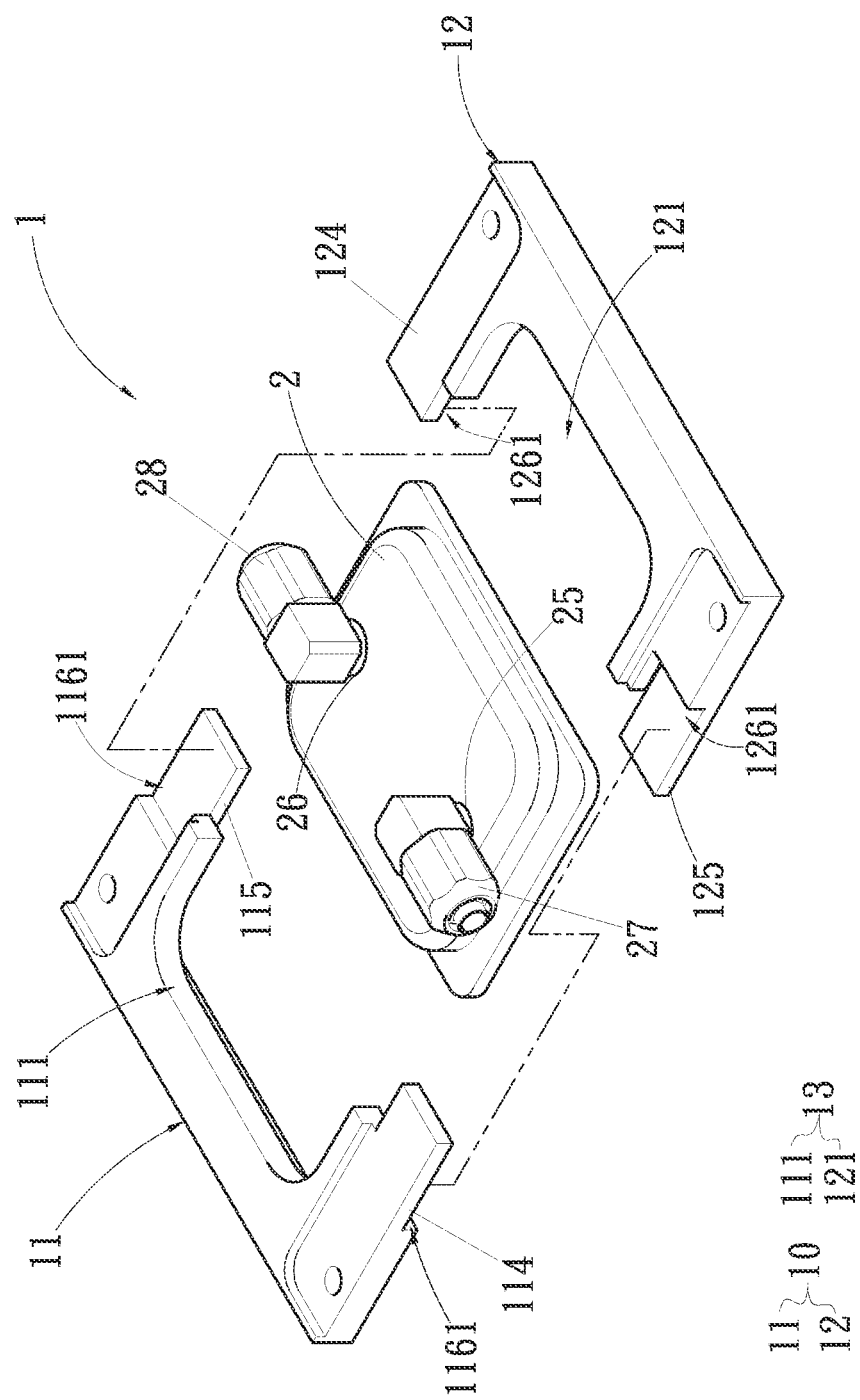
FIG. 1 is a perspective exploded view of a preferred embodiment of the present invention.

The present invention provides a knockdown water-cooling module latch device structure. Please refer to FIGS. 1 to 2D. The knockdown water-cooling module latch device structure 1 of the present invention is assembled with a water-cooling module 2. The water-cooling module 2 is a water block or a water-cooling plate. In this embodiment, water-cooling module 2 is a water block for illustration. The water-cooling module 2 is attached to a heat generation component (such as central processing unit (CPU), graphics processing unit (GPU), Southbridge/Northbridge chipsets or application specific integrated circuit (ASIC)) on a circuit board (such as motherboard or printed circuit board or carrier body) in an electronic device (such as computer, server, large-scale operation center or communication chassis, not shown). The water-cooling module 2 serves to water-cool the heat generation component to dissipate the heat of the heat generation component. The water-cooling module 2 has a water incoming opening 25, a water outgoing opening 26 and a water containing chamber (not shown). The water incoming opening 25 and the water outgoing opening 26 are respectively disposed on a top side of the water-cooling module 2.

The outer bottom side of the water-cooling module 2 is tightly attached to the heat generation component (not shown) for absorbing the heat thereof. The water containing chamber is in communication with the water incoming opening 25 and the water outgoing opening 26. A working liquid (such as pure water) is guided from the water incoming opening 25 into the water containing chamber. After heat exchange takes place between the working liquid in the water containing chamber and the bottom side of the water-cooling module 2, the working liquid carrying the heat flows out of the water outgoing opening 26. In practice, the water incoming opening 25 and the water outgoing opening 26 on the top side of the water-cooling module 2 are respectively mated with a water incoming nozzle 27 and a water outgoing nozzle 28. The water incoming nozzle 27 and the water outgoing nozzle 28 communicate with the water containing chamber via the water incoming opening 25 and the water outgoing opening 26 respectively. The water incoming nozzle 27 and the water outgoing nozzle 28 are connected with two water pipes of a water-cooling device (including a radiator and a pump, not shown).

The knockdown water-cooling module latch device structure 1 of the present invention includes a latch device assembly 10 having multiple latch members. The multiple latch members are horizontally correspondingly assembled and connected with each other to form the knockdown water-cooling module latch device structure 1 in the form of a frame body around the water-cooling module 2. The multiple latch members can be assembled and connected with each other by means of splice, lap joint, engagement, insertion, screwing, hook-and-loop fasteners, magnetic attraction or any combination thereof.

In this embodiment, the multiple latch members are two latch members, that is, a first latch member 11 and a second latch member 12. The first and second latch members 11, 12 are plate bodies made of metal material. The metal material is selected from a group consisting of aluminum, copper, iron, stainless steel, titanium, alloy and any combination thereof. In addition, the first and second latch members 11, 12 can be made of the same metal material or different metal materials. In this embodiment, the first and second latch members 11, 12 are made of stainless steel with a U-shaped configuration so as to reduce the total weight and provide higher structural strength. In a modified embodiment, the multiple latch members can be alternatively three or more than three latch members with different configurations (such as U-shaped, L-shaped or elongated strip-shaped) or the same configuration (such as L-shaped or elongated strip-shaped). The latch members are assembled and connected with each other (such as by means of lap joint, insertion, engagement or splice) to form a latch device assembly 10 in the form of a hollow frame body.

The first latch member 11 has a first connection end 114 and a first connected end 115. The first connection end 114 and the first connected end 115 are respectively positioned at two ends of the first latch member 11. In addition, the first latch member 11 is formed with a first recess 111 between two ends. The first recess 111 is inward recessed and extends from one end of the first latch member 11 in adjacency to the first connection end 114 to the other end of the first latch member 11 in adjacency to the first connected end 115, whereby the first latch member 11 is U-shaped. The second latch member 12 has a second connection end 124 and a second connected end 125. The second connection end 124 and the second connected end 125 are respectively positioned at two ends of the second latch member 12. In addition, the second latch member 12 is formed with a second recess 121 between two ends. The second recess 121 is inward recessed and extends from one end of the second latch member 12 in adjacency to the second connection end 124 to the other end of the second latch member 12 in adjacency to the second connected end 125, whereby the second latch member 12 is U-shaped. The first connection end 114 and the first connected end 115 of the first latch member 11 are recessed/raised structures and the second connection end 124 and the second connected end 125 of the second latch member 12 are raised/recessed structures in adaptation to the first connection end 114 and the first connected end 115. For example, the first connection end 114 and the first connected end 115 and the second connection end 124 and the second connected end 125 are cooperative dent (or sink) structures and protrusion block structures in any geometrical form, whereby the first and second latch members 11, 12 can be more securely connected with each other without easy detachment. In a modified embodiment, the first connection end 114 and the first connected end 115 of the first latch member 11 and the second connection end 124 and the second connected end 125 of the second latch member 12 can be alternatively corresponding magnet and metal or magnet and magnet structures.

The connection end of each latch member is assembled and connected with the connected end of the other corresponding latch member. That is, the first connection end 114 of the first latch member 11 is assembled and connected with the corresponding second connected end 125 of the second latch member 12, while the first connected end 115 of the first latch member 11 is assembled and connected with the corresponding second connection end 124 of the second latch member 12, whereby the first and second recesses 111, 121 together form a receiving space 13 for receiving the water-cooling module 2. Accordingly, the first and second latch members 11, 12 and the water-cooling module 2 in the receiving space 13 are integrally assembled. The first and second latch members 11, 12 are assembled and connected with each other in such a manner that the first connection end 114 and the first connected end 115 as parts of the first latch member 11 itself are assembled and connected with the second connected end 125 and the second connection end 124 as parts of the second latch member 12 itself (by means of lap joint, insertion, engagement or splice) to form the latch device assembly 10 (as shown in FIG. 2A) without using any additional external connection member (such as plate block or strip) as a connection bridge between the first and second latch members 11, 12.

Therefore, when the water-cooling module 2 (such as water block) is assembled on the heat generation component on the circuit board (such as motherboard), the two water pipes (such as water incoming pipe and water outgoing pipe, not shown) are first directly fitted on the water incoming nozzle 27 and the water outgoing nozzle 28 of the water-cooling module 2. Then, the first and second latch members 11, 12 horizontally oppositely arranged around the water-cooling module 2 are respectively moved in a direction to the center of the water-cooling module 2 until the first connection end 114 and the first connected end 115 of the first latch member 11 are assembled and connected with the corresponding second connected end 125 and the second connection end 124 of the second latch member 12. Then, the outer bottom side of the water-cooling module 2 assembled with the first and second latch members 11, 12 is put into contact with and attached to the heat generation component. Finally, the latch device assembly 10 is connected on the motherboard by means of screwing or latching, whereby the outer bottom face of the water-cooling module 2 can tightly securely attach to the heat generation component. The multiple latch members of the present invention can be easily and quickly assembled and connected on the water block and quickly detached from the water block or reassembled thereon. Therefore, the present invention can be conveniently used or serviced.

Figure 2A:
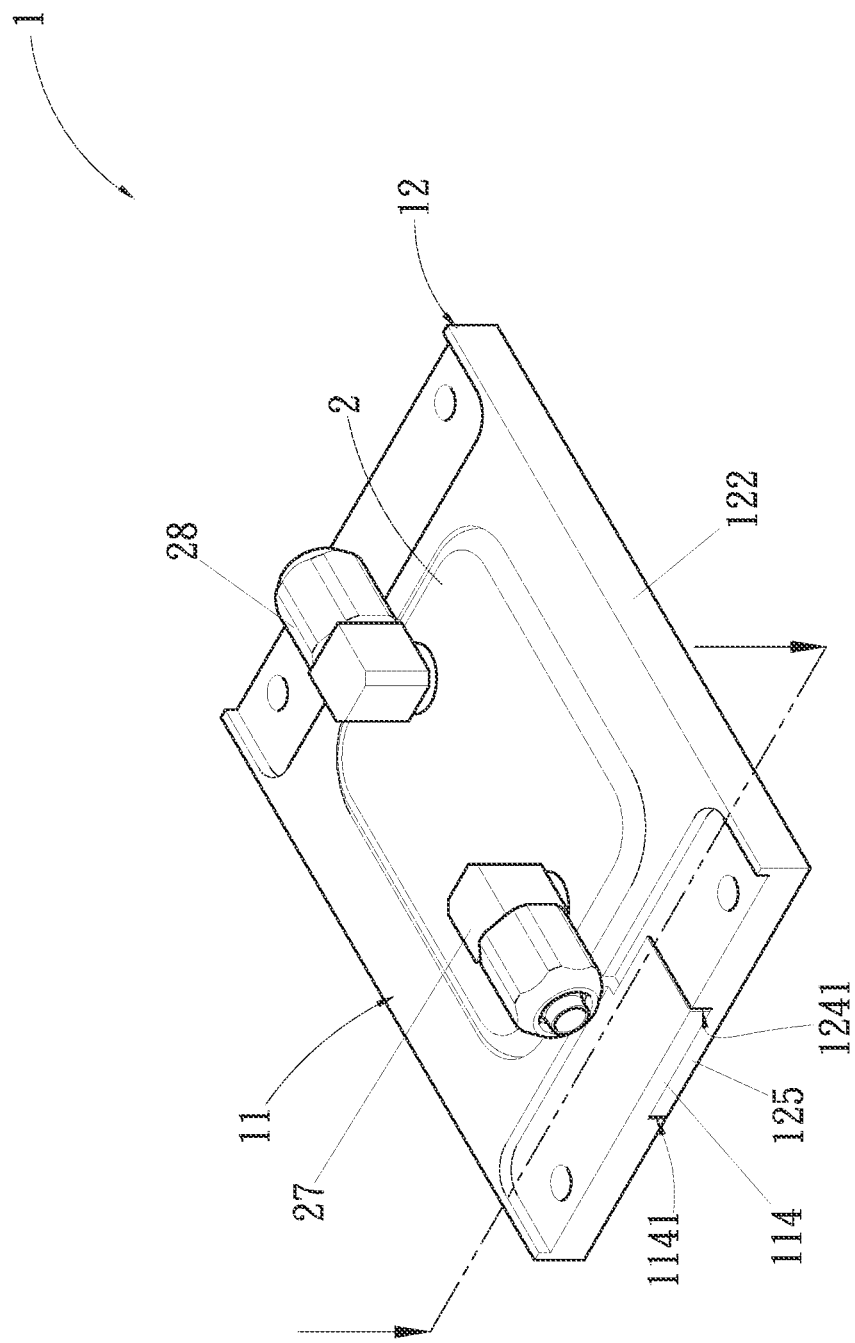
FIG. 2A is a perspective assembled view of the preferred embodiment of the present invention.
Figure 2B:
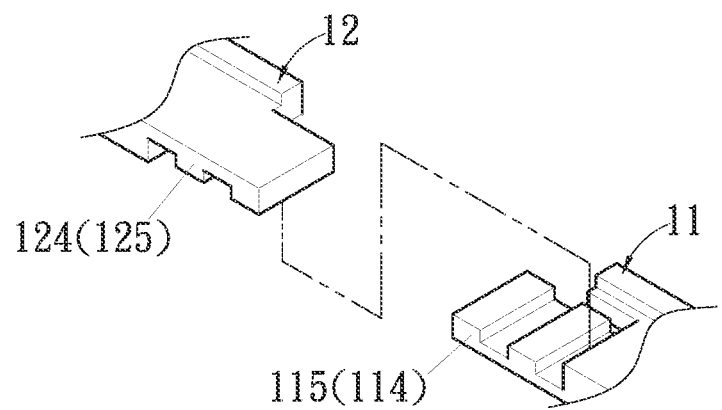
FIGS. 2B-2D are perspective views of different embodiments of the first and second connection ends and first and second connected ends of the present invention.

There are several embodiments of the first connection end 114 and the second connection end 124 and the first connected end 115 and the second connected end 125 as follows:

Please refer to FIGS. 1 and 2A. In this embodiment, the same lap joint structures are employed as the connection ends and the corresponding connected ends of the first and second latch members 11, 12. That is, each of the first connection end 114 and the first connected end 115 of the first latch member 11 is formed with a half-opened first sink 1161 on one side, while each of the second connected end 125 and the second connection end 124 of the second latch member 12 is formed with a half-opened second sink 1261 on one side. The first sinks 1161 and the second sinks 1261 serve to receive each other, whereby the first connection end 114 and the first connected end 115 of the first latch member 11 and the second connected end 125 and the second connection end 124 of the second latch member 12 are lap jointed so that the water-cooling module 2 is received in the receiving space 13 and integrally connected with the first and second latch members 11, 12. Accordingly, the latch device assembly 10 can be effectively assembled with the water-cooling module 2 without interference problem.

Figure 2C:
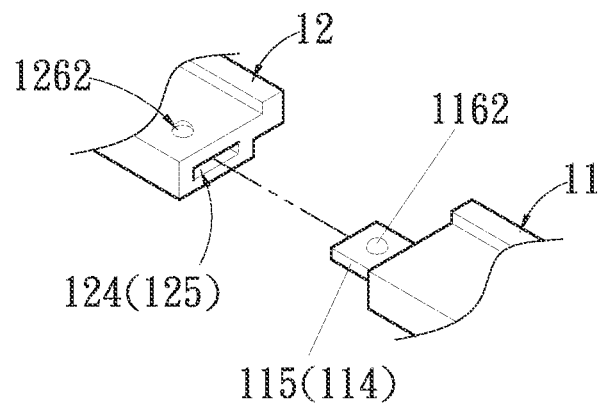

Please further refer to FIG. 2C as well as FIG. 2A. In a modified embodiment, the same splice structures (or insertion structures) are employed as the connection ends and the corresponding connected ends of the first and second latch members 11, 12. As shown in FIG. 2C, each of the first connection end 114 and the first connected end 115 of the first latch member 11 is a protrusion arm, while each of the second connected end 125 and the second connection end 124 of the second latch member 12 is an elongated socket. The protrusion arms are inserted into and connected with the elongated sockets. In addition, each of the first connection end 114 and the first connected end 115 of the first latch member 11 is formed with an engagement body 1162 (such as a boss). The engagement body 1162 is raised from one side of each of the first connection end 114 and the first connected end 115 of the first latch member 11. Each of the second connection end 124 and the second connected end 125 of the second latch member 12 is formed with an engagement dent 1262 in adaptation to the engagement body 1162. The engagement dent 1262 is disposed on an inner side of the socket of the second latch member 12, whereby the engagement body 1162 can be correspondingly securely engaged in the engagement dent 1262. The engagement dent 1262 has a configuration complementary to the configuration of the engagement body 1162.

Figure 2D:
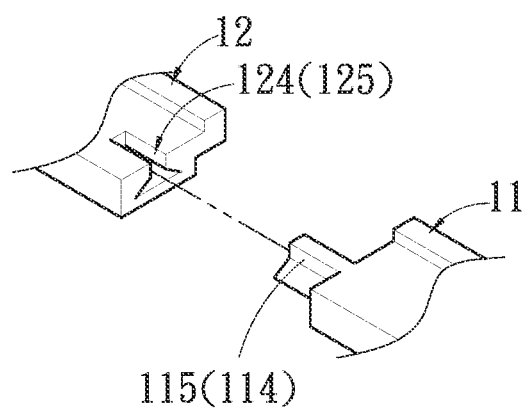

Please now refer to FIGS. 2A to 2D. In another embodiment, the connection ends and the corresponding connected ends of the first and second latch members 11, 12 are different assembling/connecting structures (such as any combination of the splice, lap joint and insertion structures). As shown in the drawings, the first connection end 114 of the first latch member 11 and the cooperative second connected end 125 of the second latch member 12 are assembled by means of the assembling/connecting structures (such as lap joint) as shown in FIG. 2A, while the first connected end 115 of the first latch member 11 and the cooperative second connection end 124 of the second latch member 12 are assembled by means of the assembling/connecting structures (such as insertion or engagement) as shown in FIG. 2D (or 2C or 2B). Accordingly, the water-cooling module 2 is received in the receiving space 13 and connected therewith.

Figure 3:
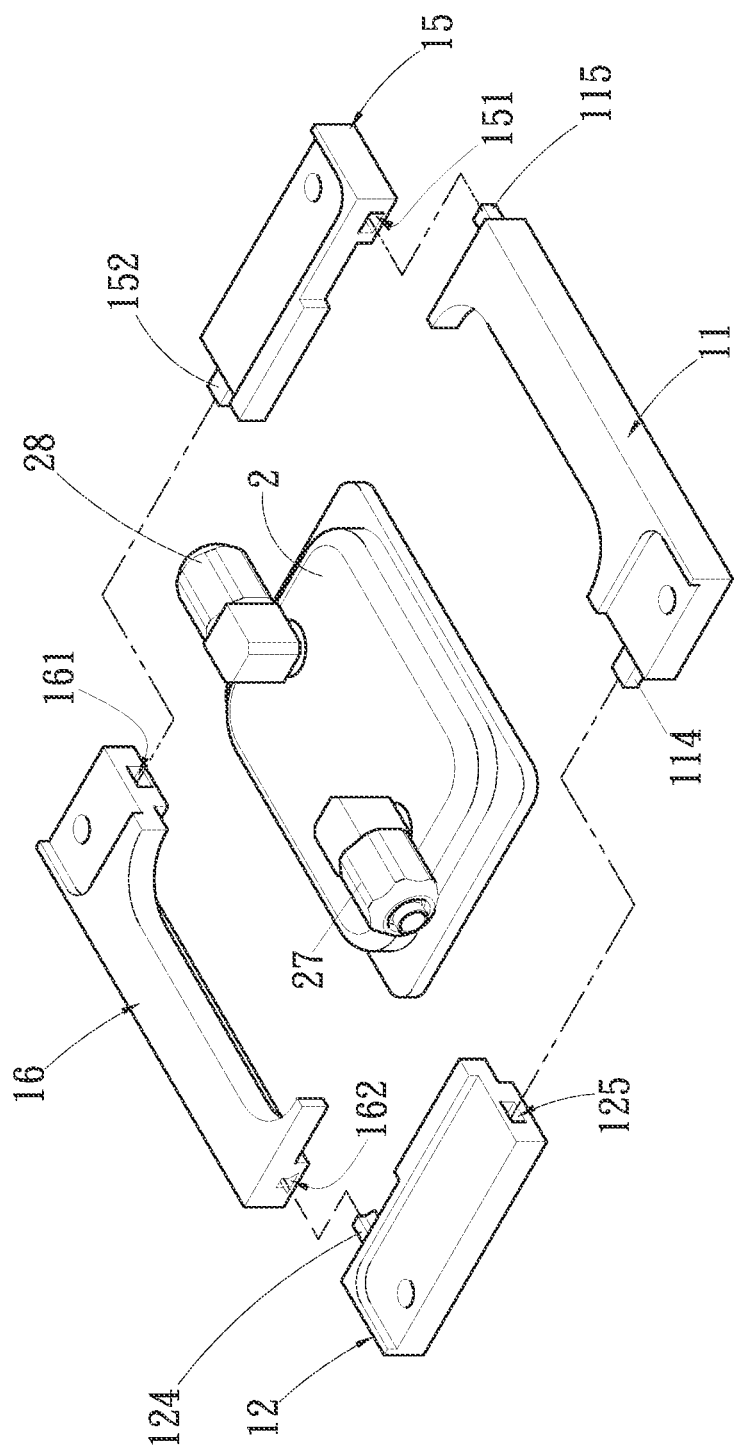
FIG. 3 is a perspective exploded view of another embodiment of the present invention.
Figure 4B:
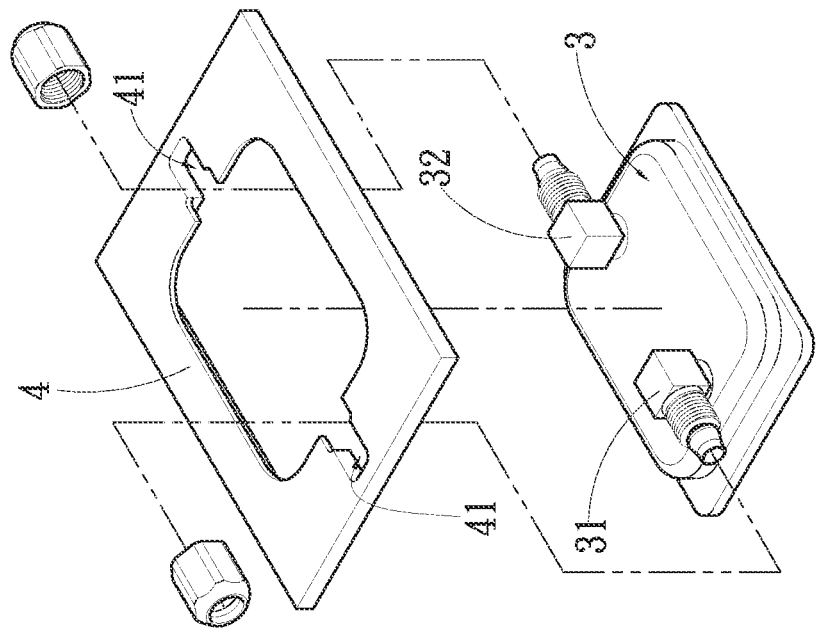
FIG. 4B is a perspective exploded view of the conventional water block latch device structure.
Figure 4A:
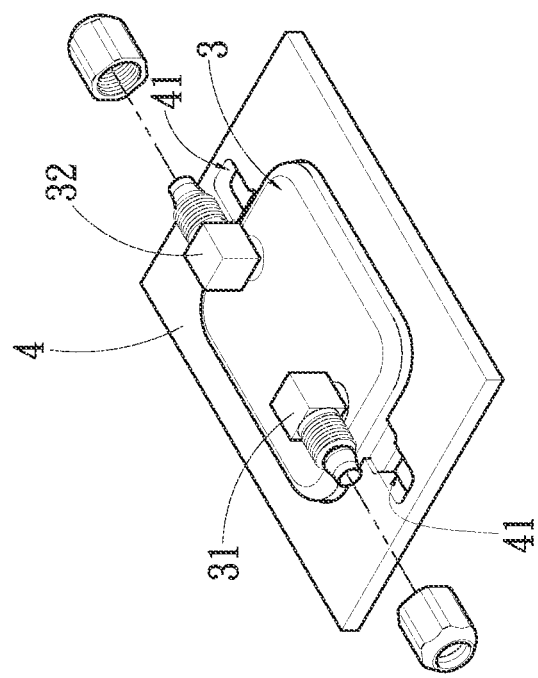
FIG. 4A is a perspective assembled view of a conventional water block latch device structure.

Please now refer to FIG. 3 as well as FIG. 2A. In another embodiment, the multiple latch members are four rectangular latch members for illustration. That is, the latch device assembly 10 includes a first latch member 11, a second latch member 12, a third latch member 15 corresponding to the second latch member 12 and a fourth latch member 16 corresponding to the first latch member 11. Each of the first, second, third and fourth latch members 11, 12, 15, 16 is formed with a connection end and a connected end. The connection ends and the corresponding connected ends of the first, second, third and fourth latch members 11, 12, 15, 16 are different assembling/connecting structures (such as splice, insertion or lap joint structures). As shown in FIG. 3, the first connection end 114 and the first connected end 115 of the first latch member 11 are protrusion bodies, while the second connected end 125 and the third connection end 151 of the second and third latch members 12, 15 are sockets in adaptation to the protrusion bodies. The protrusion bodies are inserted into the sockets. The fourth connection end 161 and the fourth connected end 162 of the fourth latch member 16 are respectively a socket and a dovetailed socket. The third connected end 152 and the second connection end 124 of the third and second latch members 12, 15 are respectively a protrusion body and a dovetailed seat in adaptation to the socket and the dovetailed socket. The protrusion body and the dovetailed seat are inserted into the socket and the dovetailed socket. Therefore, the multiple latch members, (that is, the first, second, third and fourth latch members 11, 12, 15, 16), are assembled with each other to integrally connect with the water-cooling module 2. By means of such design, the latch device assembly 10 can be effectively assembled with the water-cooling module 2 without interference problem.

In addition, in the above embodiments, in order to enhance the connection strength between the connection ends and the corresponding connected ends of the multiple latch members, the assembled connection end and connected end (such as the first connection end 114 (or the first connected end 115) and the second connected end 125 (or the second connection end 124)) can be formed with threaded holes in corresponding positions. At least one threaded member (such as a screw) is screwed into the threaded holes of the assembled connection end and connected end to securely lock the assembled connection end and connected end. This can prevent the multiple latch members (such as the first and second latch members 11, 12) from detaching from each other and ensure that the latch members are securely tightly assembled with the water-cooling module 2. In another embodiment, the first and second latch members 11, 12 and each of the four corners of the bottom section of the water-cooling module 2 corresponding to the first and second latch members 11, 12 can be formed with a perforation (not shown). Multiple screws can be screwed through the perforations to more securely lock the latch members with the water-cooling module 2, whereby the connection strength between the water-cooling module 2 and the multiple latch members (such as the first and second latch members 11, 12) can be enhanced.

Therefore, by means of the design of the knockdown water-cooling module latch device structure of the present invention, the multiple latch members are integrally assembled with the water-cooling module 2 so that the latch device assembly can be conveniently assembled with the water-cooling module 2 and the assembling freeness is higher. Moreover, the multiple latch members can be modularized. In case of the latch members (such as the first latch member 11) is damaged, it is only necessary to replace the damaged latch member with a new latch member in the same direction (such as the first latch member 11) to reassemble and reconnect with the undamaged latch member (such as the second latch member 12) for further use. Therefore, the cost can be effectively lowered. In addition, no matter whether the arrangement directions of the two nozzles (the water incoming nozzle 27 and the water outgoing nozzle 28) securely welded on the top side of the water-cooling module 2 are the same or different, the multiple latch members (such as the first and second latch members 11, 12) always can be integrally connected and assembled with the water-cooling module 2. This solves the problem existing in the conventional latch device structure that when the latch device assembly is assembled on the substrate of the water block, the water-cooling module will interfere with the latch device assembly and it is necessary to additionally manufacture a different mold for making a latch device corresponding to the different arrangement direction of the water incoming nozzle and the water outgoing nozzle of the water block and the cost is increased.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A knockdown water-cooling module latch device structure assembled and connected with a water-cooling module, the knockdown water-cooling module latch device structure comprising a latch device assembly having a first and a second latch members, each having a same structure as the other latch member and each being formed with a connection end and a connected end, the connection end of one latch member being horizontally assembled and connected with the connected end of the other latch member, such that the first and second latch members are correspondingly horizontally connected with each other to form the latch device assembly, the first and second latch members define a closed receiving space therebetween, and wherein the first and second latch members encircle the water-cooling module.

2. The knockdown water-cooling module latch device structure as claimed in claim 1, wherein the connection end and the connected end are recessed/raised structures or raised/recessed structures in adaptation to each other.

3. The knockdown water-cooling module latch device structure as claimed in claim 1, wherein the connection end and the connected end are corresponding magnet and metal or magnet and magnet structures.

4. The knockdown water-cooling module latch device structure as claimed in claim 1, wherein the first and second latch members are plate bodies made of metal material selected from a group consisting of aluminum, copper, iron, stainless steel, titanium and any combination thereof, the first and second latch members being made of the same metal material or different metal materials.

5. The knockdown water-cooling module latch device structure as claimed in claim 1, wherein the water-cooling module is a water-cooling plate or a water block.

6. The knockdown water-cooling module latch device structure as claimed in claim 1, wherein the connection end and the connected end are assembled and connected with each other by means of splice, lap joint, engagement, insertion, screwing, hook-and-loop fasteners or any combination thereof.

* * * * *